(12) United States Patent
Tanaka et al.

(10) Patent No.: US 7,645,981 B2
(45) Date of Patent: Jan. 12, 2010

(54) IMAGE PICKUP DEVICE MOUNTING STRUCTURE FOR SAVING SPACE IN AN OPTICAL DEVICE

(75) Inventors: Hitoshi Tanaka, Saitama (JP); Kunihiko Shimizu, Saitama (JP); Makio Oishi, Tokyo (JP)

(73) Assignee: Hoya Corporation, Tokyo (JP)

( * ) Notice: Subject to any disclaimer, the term of this patent is extended or adjusted under 35 U.S.C. 154(b) by 260 days.

(21) Appl. No.: 11/555,350

(22) Filed: Nov. 1, 2006

(65) Prior Publication Data

US 2007/0096234 A1    May 3, 2007

(30) Foreign Application Priority Data

Nov. 2, 2005    (JP) ............... P2005-318983

(51) Int. Cl.
*H04N 5/225* (2006.01)
*H01L 31/0203* (2006.01)

(52) U.S. Cl. ............... 250/239; 348/374; 348/373; 257/433

(58) Field of Classification Search ............... 250/239; 348/335, 340, 373, 374, 294, 376; 257/431–434
See application file for complete search history.

(56) References Cited

U.S. PATENT DOCUMENTS

| | | | |
|---|---|---|---|
| 5,051,764 A | 9/1991 | Nomura | |
| 5,079,577 A | 1/1992 | Nomura | |
| 5,581,412 A | 12/1996 | Tanaka | |
| 5,826,126 A | 10/1998 | Nomura et al. | |
| 6,493,511 B2 | 12/2002 | Sato | |
| 6,628,339 B1* | 9/2003 | Ferland et al. | 348/374 |
| 6,956,615 B2* | 10/2005 | Nakagishi et al. | 348/374 |
| 7,043,154 B2 | 5/2006 | Nomura | |
| 7,112,864 B2* | 9/2006 | Tsukamoto et al. | 257/433 |
| 7,199,436 B2* | 4/2007 | Saita | 257/432 |
| 2003/0089776 A1* | 5/2003 | Hennick et al. | 235/454 |
| 2007/0002546 A1 | 1/2007 | Nomura et al. | |
| 2007/0019084 A1 | 1/2007 | Nomura et al. | |

FOREIGN PATENT DOCUMENTS

JP    2002-330358    11/2002

OTHER PUBLICATIONS

English Language Abstract of JP 2002-330358.
U.S. Appl. No. 11/459,189 to Tanaka, filed Jul. 21, 2006.

* cited by examiner

*Primary Examiner*—Georgia Y Epps
*Assistant Examiner*—Tony Ko
(74) *Attorney, Agent, or Firm*—Greenblum & Bernstein P.L.C.

(57) ABSTRACT

An image pickup device mounting structure includes an image pickup device, a reinforcing plate, and a flexible circuit board having at least one electrical component mounted thereon, wherein the reinforcing plate; the image pickup device and a part of the flexible circuit board are superimposed on each other, the reinforcing plate includes at least one cutout portion; and the electrical component is positioned on the part of the flexible circuit board and within the cutout portion.

17 Claims, 3 Drawing Sheets

IMAGE PICKUP DEVICE MOUNTING STRUCTURE FOR SAVING SPACE IN AN OPTICAL DEVICE

BACKGROUND OF THE INVENTION

1. Field of the Invention

The present invention relates to a mounting structure of an image pickup device (installed in an optical device) to which a flexible printed circuit board is mounted.

2. Description of the Related Art

Optical devices such as digital cameras and cellular phones in which a flexible printed circuit board (hereinafter referred to as a flexible PCB) to which an image pickup device is mounted are known in the art. Electrical components are also mounted to the flexible printed circuit board around the image pickup device as needed. Among such electrical components, it is desirable for transistors, resistors, capacitors, and other specific electrical components, to be arranged in the vicinity of the image pickup device for the sake of noise reduction. On the other hand, when a flexible PCB to which an image pickup device is mounted is installed in an optical device, the image pickup device is superimposed with a reinforcing plate (mounting plate) and the flexible printed circuit board. The reinforcing plate possesses high stiffness and is fastened to the back of a portion of the flexible PCB to which the image pickup device is mounted to reinforce this portion of the flexible PCB to prevent the flexible PCB, which is poor in maintaining planarity, from bending. An example of such a structure is disclosed in Japanese unexamined patent publication No. 2002-330358.

However, in the above described configuration in which a mounting board is fastened to the back of a flexible PCB, the aforementioned electrical components (transistors, resistors, capacitors, and other specific electrical components) that are desirably arranged in the vicinity of the image pickup device cannot be arranged behind the image pickup device, and accordingly, these electrical components have to be arranged on the front of the flexible PCB around the image pickup device, which becomes a cause of an increase in size of the flexible PCB.

SUMMARY OF THE INVENTION

The present invention provides a mounting structure of an image pickup device to a flexible printed circuit board, wherein one or more electrical components can be mounted to the flexible printed circuit board in the close vicinity of the image pickup device in a space-saving manner in order to miniaturize the optical device which employs the mounting structure.

According to an aspect of the present invention, an image pickup device mounting structure is provided, including an image pickup device, a reinforcing plate, and a flexible circuit board having at least one electrical component mounted thereon, wherein the reinforcing plate, the image pickup device and a part of the flexible circuit board are superimposed on each other. The reinforcing plate includes at least one cutout portion. The electrical component is positioned on the part of the flexible circuit board and within the cutout portion.

It is desirable for the reinforcing plate to be bonded to the flexible printed circuit board to be integral with the flexible printed circuit board.

It is desirable for the reinforcing plate to be bonded to the flexible printed circuit board with a UV cure adhesive.

It is desirable for the reinforcing plate to be bonded to the flexible printed circuit board with an electrical insulating bonding agent.

It is desirable for the electrical component to be mounted on a side of the flexible printed circuit board on which the image pickup device is mounted.

Alternatively, the electrical component and the image pickup device can be mounted on opposite sides of the flexible printed circuit board, respectively.

It is desirable for the image pickup device and the flexible printed circuit board are bonded to each other.

It is desirable for the cutout portion to be a through-hole which extends through the reinforcing plate in a direction of thickness thereof.

It is desirable for the cutout portion to be a recess which is formed in the reinforcing plate in a direction of thickness thereof.

It is desirable for the image pickup device to be one of a CCD image sensor and a CMOS image sensor.

It is desirable for the reinforcing plate and the electrical component substantially to lie in a common plane.

It is desirable for the cutout portion to be one of a through-hole and a recess which is formed within the outer edge of the reinforcing plate.

In an embodiment, a mounting structure of an image pickup device to a front surface of a flexible printed circuit board is provided, the mounting structure including a reinforcing plate fixed to a back surface of the flexible printed circuit board so that the flexible printed circuit board is sandwiched between the reinforcing plate and the image pickup device, the reinforcing plate including at least one through-hole through which at least a part of the back surface of the flexible printed circuit board is exposed rearwardly; and at least one electrical component mounted on the part of the back surface of the flexible printed circuit board within the through hole in a manner to prevent the electrical component from interfering with the reinforcing plate.

It is desirable for the reinforcing plate and the electrical component to substantially lie in a common plane.

In an embodiment, a mounting structure of an image pickup device to a front surface of the flexible printed circuit board is provided, the mounting structure including a reinforcing plate fixed to the front surface of the flexible printed circuit board with the reinforcing plate sandwiched between the image pickup device and the flexible printed circuit board, the reinforcing plate including at least one through-hole through which at least a part of the front surface of the flexible printed circuit board is communicatively connected to a back surface of the image pickup device; and at least one electrical component mounted on the part of the front surface of the flexible printed circuit board so that the electrical component is aligned with the through-hole of the reinforcing plate so as to be prevented from interfering with the reinforcing plate.

It is desirable for the reinforcing plate and the electrical component to substantially lie in a common plane.

In an embodiment, a mounting structure of an image pickup device to a flexible printed circuit board is provided, the mounting structure including a reinforcing plate fixed to one of front and back surfaces of the flexible printed circuit board at a position corresponding to a position at which the image pickup device is mounted on the other of the front and back surfaces of the flexible printed circuit board; and at least one electrical component mounted on the flexible printed circuit board. The reinforcing plate includes at least one cutout portion which prevents the reinforcing plate from interfering with the electrical component.

According to the present invention, one or more electrical components can be arranged behind the image pickup device, which makes it possible to reduce the surface area of the flexible PCB to thereby achieve miniaturization of the optical device.

The present disclosure relates to subject matter contained in Japanese Patent Application No.2005-318983 (filed on Nov. 2, 2005), which is expressly incorporated herein by reference in its entirety.

BRIEF DESCRIPTION OF THE DRAWINGS

The present invention will be described below in detail with reference to the accompanying drawings in which.

DESCRIPTION OF THE PREFERRED EMBODIMENTS

First Embodiment

Figure 1:
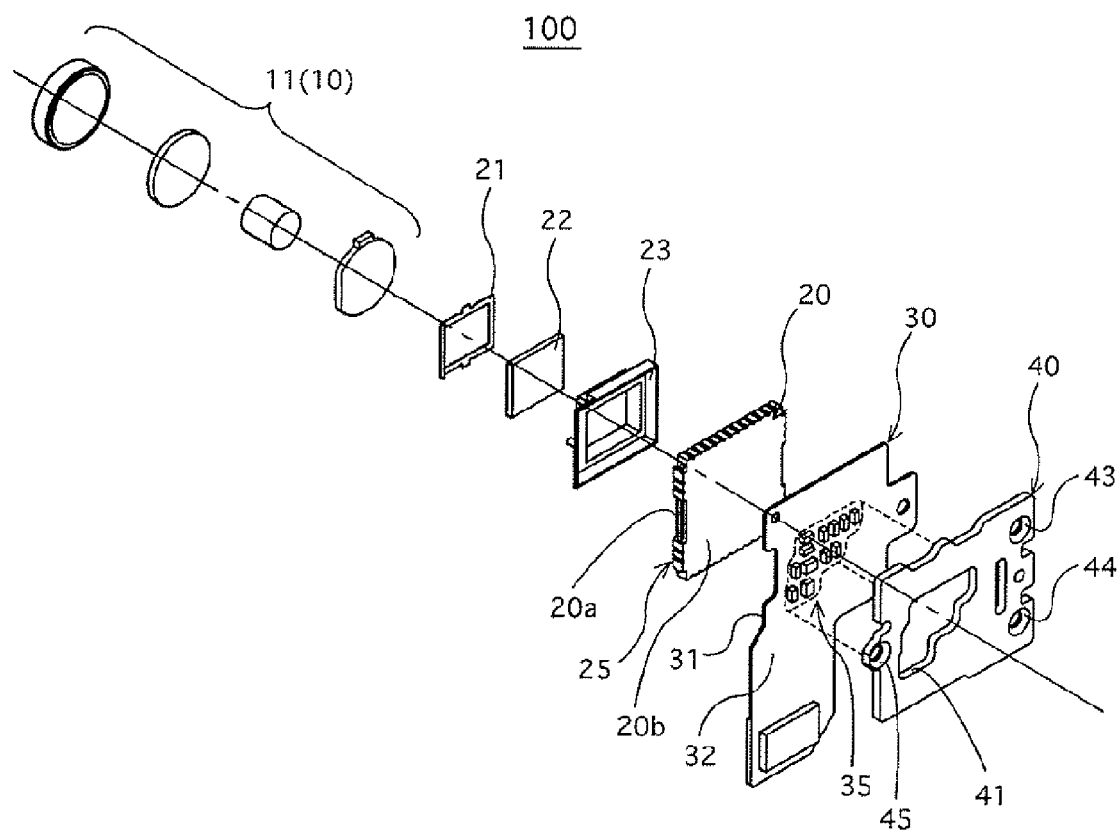
FIG. 1 is an exploded perspective view of a lens unit which adopts a first embodiment of a mounting structure of an image pickup device to a flexible printed circuit board according to the present invention, showing the overall structure of the lens unit.

FIG. 1 shows main elements of a lens unit 100 which adopts a first embodiment of a mounting structure of an image pickup device to a flexible printed circuit board. The first embodiment of the mounting structure is provided with an image pickup device 20, a flexible PCB 30 and a reinforcing plate (mounting plate) 40. Light which emerges from a lens module 10 is incident on the image pickup device 20 to be focused thereon. The flexible PCB 30 is fixed to the image pickup device 20 and is electrically connected thereto. The lens module 10 is provided with a housing (not shown) and a plurality of lens elements 11 which are housed in the housing and supported thereby.

For instance, a surface-mount type of CCD (charge-coupled device) or CMOS (complementary metal oxide semiconductor), image sensor having a substantially rectangular shape in plan configuration, can be adopted as the image pickup device 20. The lens unit 100 is provided, in front of a front surface (imaging surface) 20a of the image pickup device 20, with an aperture plate 21, an optical low-pass filter 22 and a cover frame 23, in that order from the lens module 10 side.

The flexible PCB 30 is provided with a flexible substrate made of, e.g., polyester film or a polyimide film, and a plurality of conductor traces formed on one surface (front surface) 31 of the flexible PCB 30 (e.g., a plurality of copper traces bonded to the front surface 31). A plurality of contacts 25 which project from the image pickup device 20 are soldered to a corresponding plurality of conductor traces of the flexible PCB 30, respectively, thereby fixing a back surface 20b of the image pickup device 20 to the front surface 31 of the flexible PCB 30. The strength of this fixation can be enhanced by bonding the image pickup device 20 and the flexible PCB 30 to each other. Using the flexible PCB 30 as a printed circuit board in this manner makes it possible to enhance the degree of freedom in placement of the lens module 10.

Electrical components (e.g., transistors, resistors and capacitors) 35 which are to be arranged in the vicinity of the image pickup device 20 are mounted to a portion of the other surface (back surface) 32 of the flexible PCB 30 on the opposite side of the flexible PCB 30 from the image pickup device 20 (a portion of the back surface 32 of the flexible PCB 30 on which an orthogonal projection of the image pickup device 20 is formed when the image pickup device 20 and the flexible PCB 30 are positioned parallel to each other). For instance, each terminal of the electrical components 35 is inserted into a corresponding through hole of the flexible PCB 30, which is made in the flexible PCB 30 to extend therethrough from the front surface 31 to the back surface 32, to be electrically connected to a corresponding conductor trace on the front surface 31 of the flexible PCB 30. By arranging the electrical components 35 on a portion of the back surface 32 which corresponds to the portion of the front surface 31 to which the image pickup device 20 is mounted in this manner, the electrical components 35 no longer need to be conventionally arranged around the image pickup device 20 on the same side surface of the flexible PCB 30, which makes it possible to make the outside shape of the flexile PCB 30 smaller than that of the prior art, to thereby achieve miniaturization of the lens unit 100.

The reinforcing plate 40 is made of a metal plate which possesses high stiffness (e.g., an aluminum or SUS plate), and is provided with an opening (cutout portion/through-hole) 41 which extends through the reinforcing plate 40 in the direction of the thickness thereof at a substantially central portion of the reinforcing plate 40. The size and shape of the opening 41 are determined so that the electrical components 35 and the reinforcing plate 40 do not interfere with each other when the image pickup device 20, the flexible PCB 30 and the reinforcing plate 40 are superimposed on each other and fixed to the lens module 10. The reinforcing plate 40 is adhered to the flexible PCB 30 with a bonding agent which is dripped onto an inner edge 41a of the opening 41. It is desirable that an electrical insulating bonding agent be used as this bonding agent, e.g., a UV cure adhesive can be used. The shape and the position of the opening 41 on the reinforcing plate 40 are optional and more than one of the opening 41 can be made in the reinforcing plate 40 so long as the electrical components 35 and the reinforcing plate 40 do not contact each other when the flexible PCB 30 and the reinforcing plate 40 are overlaid on each other. For instance, the opening 41 of the reinforcing plate 40 can be replaced by a recess or a groove which does not extend completely through the reinforcing plate 40 in the direction of the thickness thereof. However, it is desirable that the opening 41 (or such a recess or groove) not be in the shape of a regular polygon to ensure adequate adhesive strength between the flexible PCB 30 and the reinforcing plate 40.

Figure 2A:
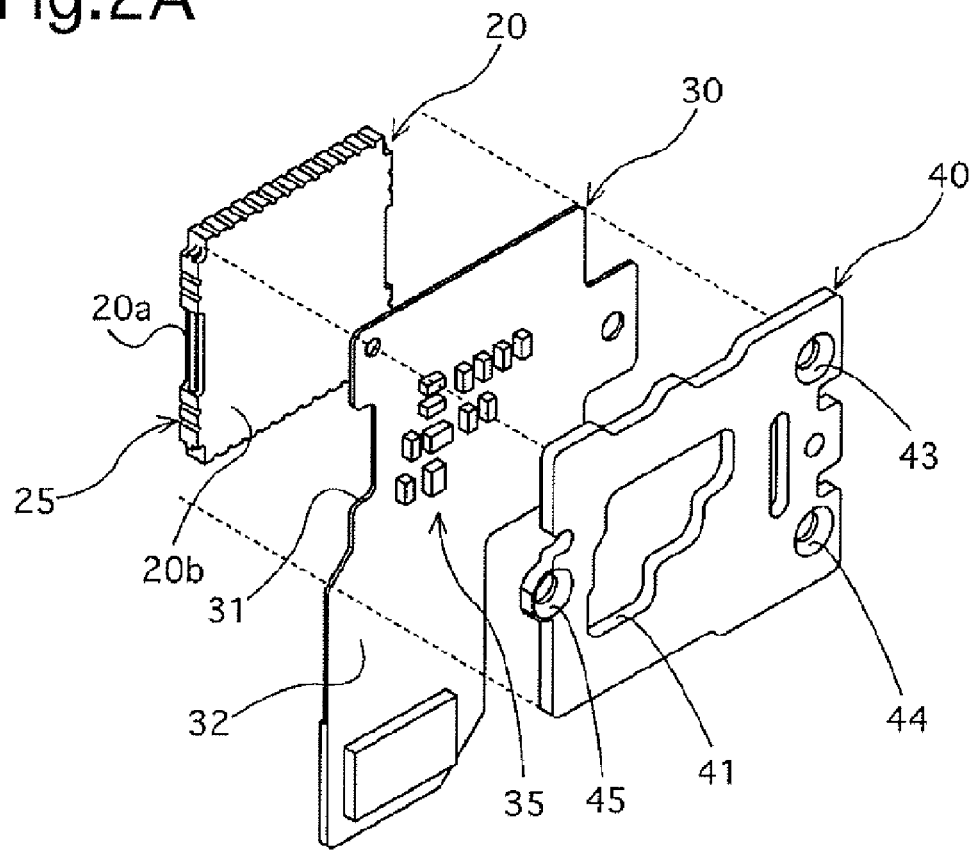
FIG. 2A is an exploded perspective view of a portion of the lens unit shown in FIG. 1 which includes an image pickup device, a flexible PCB and a reinforcing plate, showing a state before the image pickup device, the flexible PCB and the reinforcing plate are integrated in a superimposed manner.
Figure 2B:
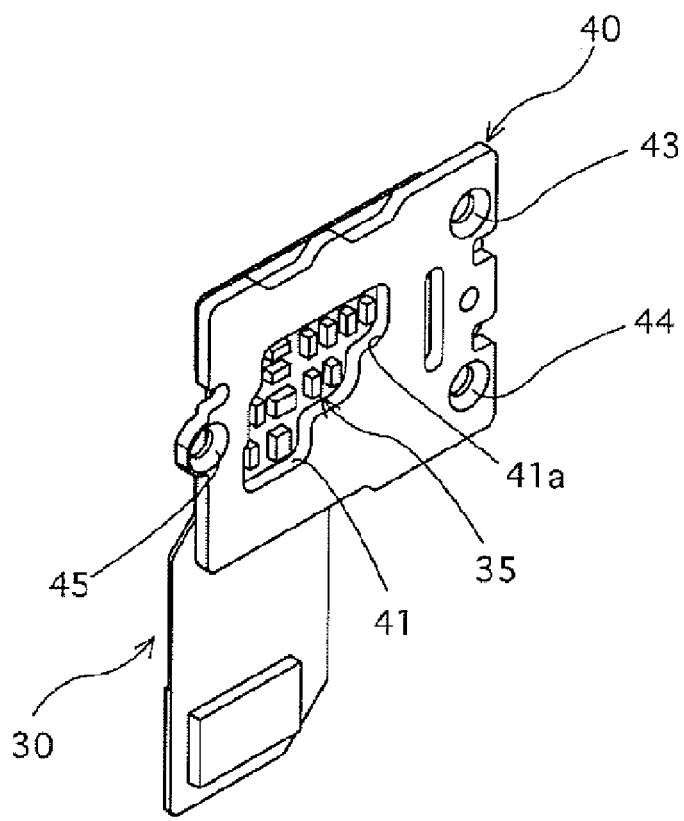
FIG. 2B is an exploded perspective view of the elements shown in FIG. 2A, showing a state where the image pickup device, the flexible PCB and the reinforcing plate have been integrated in a superimposed manner.

As described above, the image pickup device 20, the flexible PCB 30 and the reinforcing plate 40 are superimposed as shown in FIG. 2B by mounting the image pickup device 20 on the front surface 31 of the flexile PCB 30 and bonding the flexile PCB 30 and the reinforcing plate 40 to each other. The image pickup device 20, the flexible PCB 30 and therein forcing plate 40 which are thus integrated in a superimposed manner are fixed to the lens module 10 with the image pickup device 20 being positioned on the lens module by three set screws (not shown) which are inserted into three through holes 43, 44 and 45 of the reinforcing plate 40 to be screwed into three female screw holes (not shown) of the aforementioned housing (not shown) of the lens module 10, respectively, which completes the lens unit 100. In this manner, the electrical components 35 are arranged on the back surface 32 of the flexible PCB 30 so as to substantially lie in a common plane with that of the reinforcing plate 40, to thereby achieve miniaturization of the lens unit 100 by providing the reinforcing plate 40, that supports the image pickup device 20, with the opening 41, while the image pickup device 20, the flexible PCB 30 and the reinforcing plate 40 are superimposed so as to be detachably attached to the lens module 10, Accordingly, the position of the superimposed combination of the image pickup device 20, the flexible PCB 30 and the reinforcing plate 40 can be easily readjusted and each of the lens module 10 and the superimposed combination of the image pickup device 20, the flexible PCB 30 and the reinforcing plate 40 can be easily repaired or replaced. Moreover, the relative positions among the lens module 10, the image pickup device 20, the flexible PCB 30 and the reinforcing plate 40 can be easily readjusted.

Second Embodiment

Figure 3A:
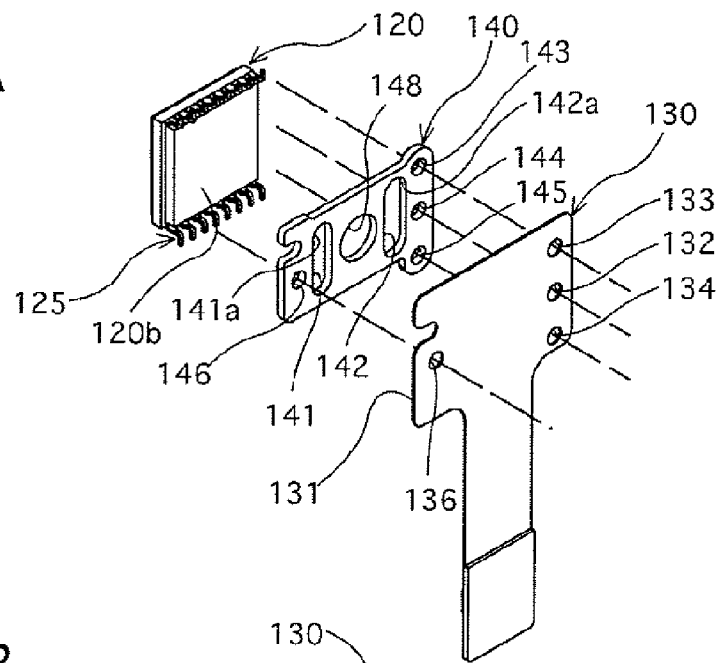
FIG. 3A is an exploded perspective view of a second embodiment of the mounting structure according to the present invention, showing structures of an image pickup device, a flexible PCB and a reinforcing plate of the lens unit.
Figure 3B:
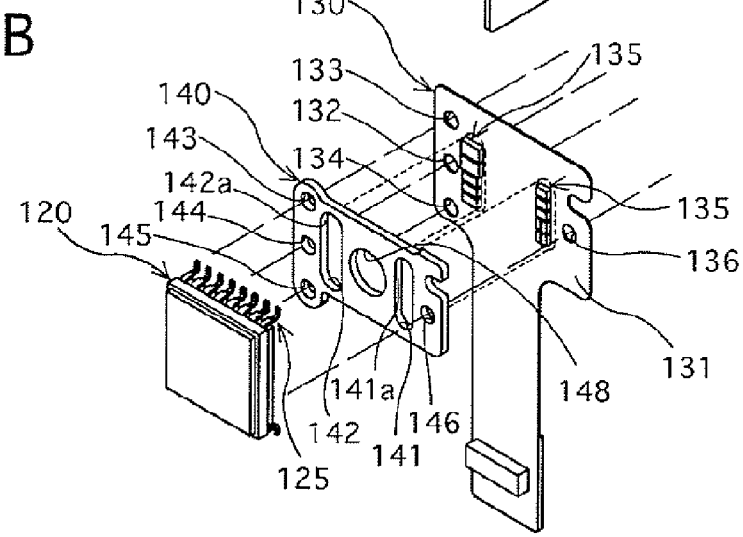
FIG. 3B is an exploded perspective view of the elements shown in FIG. 3A, viewed from a different angle.
Figure 3C:
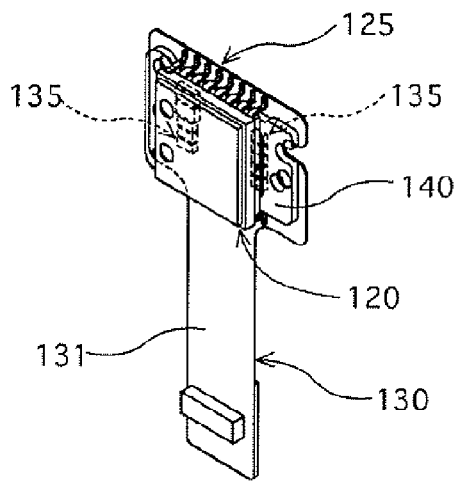
FIG. 3C is a perspective view of the elements shown in FIGS. 3A and 3B, showing a state where the image pickup device, the flexible PCB and the reinforcing plate have been integrated in a superimposed manner.

A second embodiment of the mounting structure will be discussed hereinafter. The second embodiment of the mounting structure shown in FIGS. 3A, 3B and 3C is different from the first embodiment of the mounting structure shown in FIGS. 1, 2A and 2B in that the second embodiment of the mounting structure is provided with an image pick up device 120, a flexible PCB 130 and a reinforcing plate 140 instead of the image pick up device 20, the flexible PCB 30 and the reinforcing plate 40 that are arranged from the lens module side, respectively. Apart from this difference, the second embodiment of the mounting structure has the same structure as the first embodiment of the mounting structure.

Similar to the flexible PCB 30, the flexible PCB 130 is provided with a flexible substrate and a plurality of conductor traces formed on one surface (front surface) 131 of the flexible PCB 130. A plurality of contacts 125 which project from the image pickup device 120 are soldered to a corresponding plurality of conductor traces of the flexible PCB 130, respectively, thereby fixing a back surface 120b of the image pickup device 120 to the front surface 131 of the flexible PCB 130.

Electrical components (e.g., transistors, resistors and capacitors) 135 which are to be arranged in the vicinity of the image pickup device 120 are mounted to a portion of the front surface 131 of the flexible PCB 130 which faces the back surface 120b of the image pickup device 120 (a portion of the front surface 131 of the flexible PCB 130 on which an orthogonal projection of the image pickup device 120 is formed when the image pickup device 120 and the flexible PCB 130 are positioned parallel to each other). For instance, each terminal of the electrical components 135 is soldered to a corresponding conductor trace on the front surface 131 of the flexible PCB 130 to thereby be electrically connected thereto. By arranging the electrical components 135 on a portion of the front surface 131 which faces the image pickup device 120 in this manner, the electrical components 135 no longer need to be conventionally arranged around the image pickup device 120 on the same side surface of the flexible PCB 130, which makes it possible to make the outside shape of the flexile PCB 130 smaller than before to thereby achieve miniaturization of the lens unit 100.

The reinforcing plate 140 is made of a metal plate which also possesses a high stiffness like that of the reinforcing plate 40, and is provided with two openings (cutout portions/through-holes) 141 and 142, each of which extends through the reinforcing plate 140 in the direction of the thickness thereof. The shapes and sizes of the two opening 141 and 142 are determined so that the electrical components 135 and the reinforcing plate 140 do not interfere with each other when the image pickup device 120, the flexible PCB 130 and the reinforcing plate 140 are superimposed on each other and fixed to the lens module 10. The reinforcing plate 140 is further provided at a substantially center thereof with a circular opening (through-hole) 148 which extends through the reinforcing plate 140 in the direction of the thickness thereof. The reinforcing plate 140 is adhered to the back surface 120b of the image pickup device 120 with a bonding agent which is dripped into the circular opening 148. After the completion of this fastening of the reinforcing plate 140 to the image pickup device 120, the image pickup device 120 is mounted to the flexible PCB 130 with the reinforcing plate 140 sandwiched between the image pickup device 120 and the flexible PCB 130. It is desirable that an electrical insulating bonding agent be used as the bonding agent, e.g., a UV cure adhesive can be used. The shapes and the positions of the two openings 141 and 142 of the reinforcing plate 140 on the reinforcing plate 140 are optional. More than two openings corresponding to the two openings 141 and 142 can be made in the reinforcing plate 140 so long as the electrical components 135 and the reinforcing plate 140 do not contact each other when the flexible PCB 130 and the reinforcing plate 140 are overlaid on each other. For instance, each of the two openings 141 and 142 of the reinforcing plate 140 can be replaced by a recess or a groove which does not extend completely through the reinforcing plate 140 and which is recessed in a direction away from the flexible PCB 130.

As described above, the image pickup device 120, the flexible PCB 130 and the reinforcing plate 140 are superimposed on each other as shown in FIG. 3C by bonding the flexile PCB 130 and the reinforcing plate 140 to each other, and subsequently mounting the image pickup device 120 to the flexible PCB 130. The image pickup device 120, the flexible PCB 130 and the reinforcing plate 140 which are thus integrated in a superimposed manner are fixed to the lens module 10 with the image pickup device 120 being positioned on the lens module by four set screws (not shown) which are inserted into four through holes 133, 132, 134 and 136 of the flexible PCB 130 and corresponding four through holes 143, 144, 145 and 146 of the reinforcing plate 140 to be screwed into four female screw holes (not shown) of the aforementioned housing (not shown) of the lens module 10, respectively, which completes the lens unit 100. In this manner, the electrical components 135 can be arranged on the front surface 131 of the flexible PCB 130 so as to substantially lie in a common plane with that of the reinforcing plate 140r to thereby achieve miniaturization of the lens unit 100 by providing the reinforcing plate 140 that supports the image pickup device 120 with the two openings 141 and 142, while the image pickup device 120, the flexible PCB 130 and the reinforcing plate 140 are superimposed to become capable of being detachably attached to the lens module 10. Accordingly, the position of the superimposed combination of the image pickup device 120, the flexible PCB 130 and the reinforcing plate 140 can be easily readjusted and each of the lens module 10 and the superimposed combination of the image pickup device 120, the flexible PCB 130 and the reinforcing plate 140 can be easily repaired or replaced. Moreover, the relative positions among the lens module 10, the image pickup device 120, the flexible PCB 130 and the reinforcing plate 140 can be easily readjusted. Note that other effects and functions are identical to those in the first embodiment of the mounting structure.

Obvious changes may be made in the specific embodiments of the present invention described herein, such modifications being within the spirit and scope of the invention claimed. It is indicated that all matter contained herein is illustrative and does not limit the scope of the present invention.

What is claimed is:

1. An image pickup device mounting structure, comprising:
   an image pickup device;
   a reinforcing plate; and
   a flexible circuit board having at least one electrical component mounted thereon, and the flexible circuit board comprising a film,
   wherein said reinforcing plate, said image pickup device and a part of said flexible circuit board are superimposed on each other such that a surface of said image pick up device overlays a surface of said reinforcement plate in a stacking direction of said image pickup device mounting structure,
   wherein said reinforcing plate includes at least one cutout portion,
   wherein said electrical component is positioned on said part of said flexible circuit board and within said cutout portion, said electrical component being positioned within an area defined by an orthogonal projection of said image pickup device; and
   wherein said image pickup device is directly mounted on said flexible circuit board so that opposing surfaces of said image pickup device and said flexible circuit board come into face-to-face contact with each other.

2. The image pickup device mounting structure according to claim 1, wherein said reinforcing plate is bonded to said flexible printed circuit board to be integral with said flexible printed circuit board.

3. The image pickup device mounting structure according to claim 2, wherein said reinforcing plate is bonded to said flexible printed circuit board with a UV cure adhesive.

4. The image pickup device mounting structure according to claim 2, wherein said reinforcing plate is bonded to said flexible printed circuit board with an electrical insulating bonding agent.

5. The image pickup device mounting structure according to claim 1, wherein said electrical component is mounted on a side of said flexible printed circuit board on which said image pickup device is mounted.

6. The image pickup device mounting structure according to claim 1, wherein said electrical component and said image pickup device are mounted on opposite sides of said flexible printed circuit board, respectively.

7. The image pickup device mounting structure according to claim 6, wherein said image pickup device and said flexible printed circuit board are bonded to each other.

8. The image pickup device mounting structure according to claim 1, wherein said cutout portion comprises a through-hole which extends through said reinforcing plate in a direction of thickness thereof.

9. The image pickup device mounting structure according to claim 1, wherein said cutout portion comprises a recess which is formed in said reinforcing plate in a direction of thickness thereof.

10. The image pickup device mounting structure according to claim 1, wherein said image pickup device comprises one of a CCD image sensor and a CMOS image sensor.

11. The image pickup device mounting structure according to claim 1, wherein said reinforcing plate and said electrical component substantially lie in a common plane.

12. The image pickup device mounting structure according to claim 11, wherein said cutout portion comprises one of a through-hole and a recess which is formed within the outer edge of said reinforcing plate.

13. A mounting structure of an image pickup device to a front surface of a flexible printed circuit boards, said mounting structure comprising:
   a reinforcing plate fixed to a back surface of said flexible printed circuit board so that said flexible printed circuit board is sandwiched between said reinforcing plate and said image pickup device, said reinforcing plate including at least one through-hole through which at least a part of said back surface of said flexible printed circuit board is exposed rearwardly; and
   at least one electrical component mounted on said part of said back surface of said flexible printed circuit board within said through hole in a manner to prevent said electrical component from interfering with said reinforcing plate.

14. The mounting structure according to claim 13, wherein said reinforcing plate and said electrical component substantially lie in a common plane.

15. A mounting structure of an image pickup device to a front surface of said flexible printed circuit board, said mounting structure comprising:
   a reinforcing plate fixed to said image pick up device with said reinforcing plate sandwiched between said image pickup device and said flexible printed circuit board, said reinforcing plate including at least one through-hole through which at least a part of said front surface of said flexible printed circuit board is communicatively connected to a back surface of said image pickup device; and
   at least one electrical component mounted on said part of said front surface of said flexible printed circuit board so that said electrical component is positioned within said through-hole of said reinforcing plate so as to be prevented from interfering with said reinforcing plate.

16. The mounting structure according to claim 15, wherein said reinforcing plate and said electrical component substantially lie in a common plane.

17. A mounting structure of an image pickup device to a flexible printed circuit board, said mounting structure comprising:
   a reinforcing plate fixed to one of front and back surfaces of said flexible printed circuit board at a position corresponding to a position at which said image pickup device is mounted on the other of said front and back surfaces of said flexible printed circuit board; and
   at least one electrical component mounted on said flexible printed circuit board,
   wherein said reinforcing plate includes at least one cutout portion which prevents said reinforcing plate from interfering with said electrical component, and
   wherein said at least one electrical component is positioned within said at least one cutout portion.

* * * * *